United States Patent
Wu et al.

(10) Patent No.: US 10,231,034 B1
(45) Date of Patent: Mar. 12, 2019

(54) INFORMATION HANDLING SYSTEM CABLE SEAL

(71) Applicant: Dell Products L.P., Round Rock, TX (US)

(72) Inventors: Renner Wu, New Taipei (TW); Kuang Hsi Lin, Taouyuan (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/860,987

(22) Filed: Jan. 3, 2018

(51) Int. Cl.
| | |
|---|---|
| *H04Q 1/04* | (2006.01) |
| *G06F 1/20* | (2006.01) |
| *H04Q 1/06* | (2006.01) |
| *H04Q 1/02* | (2006.01) |
| *H05K 7/20* | (2006.01) |
| *G06F 1/18* | (2006.01) |

(52) U.S. Cl.
CPC ............. *H04Q 1/04* (2013.01); *G06F 1/20* (2013.01); *H04Q 1/023* (2013.01); *H04Q 1/026* (2013.01); *H04Q 1/06* (2013.01); *H05K 7/20736* (2013.01); *G06F 1/181* (2013.01)

(58) Field of Classification Search
CPC ...... H02G 3/083; H02G 15/013; H02G 3/081; H02G 3/088; H02G 3/22; H02G 15/117; H02G 3/085; H02G 3/16
USPC .......................................................... 361/695
See application file for complete search history.

(56) References Cited

U.S. PATENT DOCUMENTS

| | | | | |
|---|---|---|---|---|
| 5,860,291 A | * | 1/1999 | Johnson ................... | G06F 1/20 |
| | | | | 361/692 |
| 6,666,415 B2 | * | 12/2003 | Hansen ..................... | F16B 2/06 |
| | | | | 248/74.1 |

* cited by examiner

*Primary Examiner* — Mandeep S Buttar
(74) *Attorney, Agent, or Firm* — Zagorin Cave LLP; Robert W. Holland

(57) ABSTRACT

An information handling system routes cables from a chassis interior to a chassis exterior through a cable channel defined in the housing and having airflow managed by a blocking element biased to a closed position. As cable configurations change, the blocking element adapts to fit cables through the cable channel in a compact manner that minimizes cooling airflow escape through the cable channel. Automated adjustments to a cooling fan profile based upon a predicted cable configuration and associated airflow help to ensure adequate cooling as airflow characteristics change due to the presence of cables and an expected position of the blocking element.

18 Claims, 4 Drawing Sheets

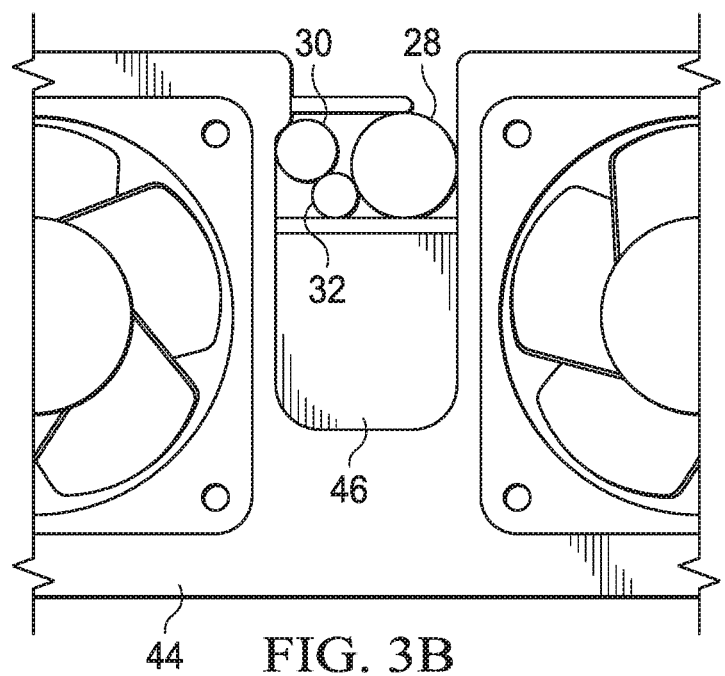
44  FIG. 3B
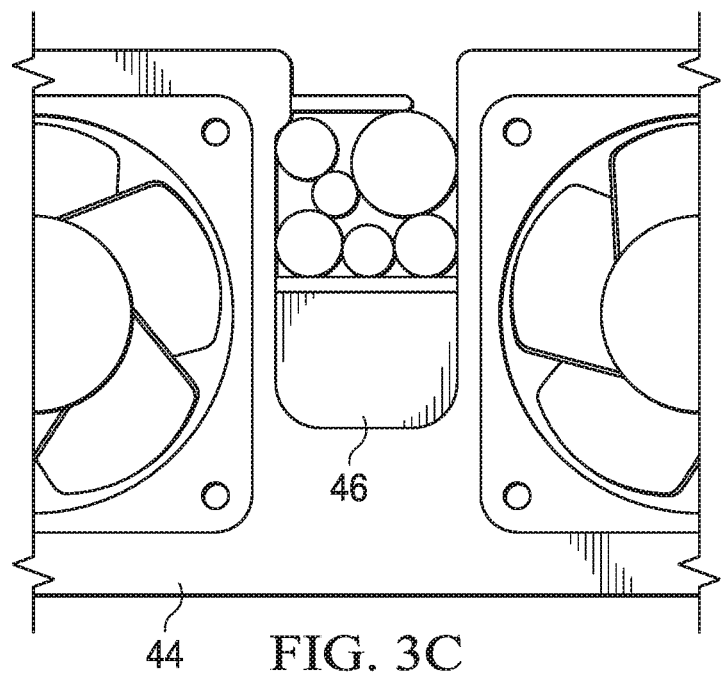
44  FIG. 3C

INFORMATION HANDLING SYSTEM CABLE SEAL

BACKGROUND OF THE INVENTION

Field of the Invention

The present invention relates in general to the field of information handling system cable management, and more particularly to a server information handling system cable seal.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include a variety of components interfaced by cabled connections. Cables provide efficient and high bandwidth conduits for communicating information between hardware devices. For example, cabled interfaces between a storage controller and multiple storage devices provide rapid information retrieval and storage in concert with persistent storage devices, such as solid state drives (SSD) and hard disk drives (HDD). In some instances, cables provide communication between circuit boards, such as daughter cards and motherboards, and an external network, such as through Ethernet or other networking interfaces. In other instances, cables provide power from a power supply to circuit boards and components. In server information handling systems that have multiple storage devices and other processing components, a variety of cables of different sizes may run through and out of the server information handling system housing.

Information handling systems generate heat as a byproduct of normal operations, such when power is applied to processing components. The amount of heat created depends upon the number of components that use power and varies considerably during normal operations as power dissipation through processing components varies. Typically, information handling systems include one or more cooling fans that generate a cooling airflow to remove the excess heat. Generally, processing components are distributed relative to the airflow so that heat generating components will have adequate cooling airflow to remain within operating constraints. For example, cooling fans typically direct airflow first across processors that tend to dissipate large amounts of power and then across other components. As power dissipation changes, such as with processing workload, cooling airflow speed is adapted to maintain desired thermal conditions. Information handling system manufacturers often design housings that direct the cooling airflow in a manner that efficiently removes excess heat from within the housing.

One difficulty that arises with providing sufficient cooling in a housing is that a configuration of components and cables within a housing may change as the system is used. For example, adding storage devices to a server information handling system not only changes the power dissipated within the housing but also changes airflow characteristics, such as impedance. Routing of cables between the added components can create unpredictable airflow paths that impact system cooling, such as by providing airflow an escape path at the ingress of cables to the housing structure. In such a scenario, a ten percent or greater decrease in airflow across critical components may occur. Reduced effective airflow means that cooling fans must work harder to provide sufficient cooling, thus increasing acoustics and power consumption, or system components must dissipate less power to reduce thermal generation, such as by operating at lower performance levels. In some situations, cooling airflow may be preserved by inserting foam or other sealants around additional cables as the cables are added, however, such ad hoc solutions tend to give unpredictable results so that cooling across similar housings with similar configurations may vary considerably.

SUMMARY OF THE INVENTION

Therefore, a need has arisen for a system and method which manages cable routing in an information handling system to provide consistent cooling airflow as cable configurations change.

In accordance with the present invention, a system and method are provided which substantially reduce the disadvantages and problems associated with previous methods and systems for managing cable routing in an information handling system. A blocking element biases into a cable channel to compress cables routed through the cable channel and reduce airflow between the interior and exterior of the information handling system through the cable channel.

More specifically, an information handling system processes information with processing components disposed in a chassis, such as one or more central processing units (CPU) that execute instructions, memory that stores instructions and a chipset that includes processing resources for managing physical interactions at the information handling system. Cables couple to processing components within the interior of the information handling system chassis and route out to the chassis exterior. A blocking element slidingly engages the cable channel to selectively block airflow from passing through the cable channel. For example, a biasing spring biases the blocking element to a closed position that compresses cables routed through the cable channel, thus reducing space for airflow to pass by the cables and into the cable channel. As the cable configuration changes, such as with the addition or removal processing components in the chassis interior, the blocking element biases to a closed position around the cables, thus compressing the cables within the cable channel to reduce the room for airflow. In one embodiment, a cable configuration is derived at a cooling fan controller, such as by using an inventory of processing components disposed in the chassis interior that use cables, and the cable configuration is used to adjust cooling fan operation, such as to adapt to impedance of airflow related to the cables and the space within the cable channel that allows cooling airflow to pass.

The present invention provides a number of important technical advantages. One example of an important technical advantage is that an information handling system adopts to different cable configurations with predictable and efficient cooling airflow paths. A defined cable channel routes cables across boundaries that define different airflow zones and biases to a closed position so that airflow is impeded across the boundary. As cable configurations change across the channel, the channel size adapts to accept the cables while maintaining a consistent airflow characteristic. An information handling system detects its physical configuration and associated cable configuration to approximate cooling characteristics associated with the cable configuration so that accurate cooling profiles are maintained.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 3A-3D depict a cable channel disposed between cooling fans and adapting to different cable configurations.

DETAILED DESCRIPTION

A cable channel integrated in an information handling system chassis routes cables between a chassis interior and exterior past a blocking element biased to a closed position to manage airflow through the cable channel. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
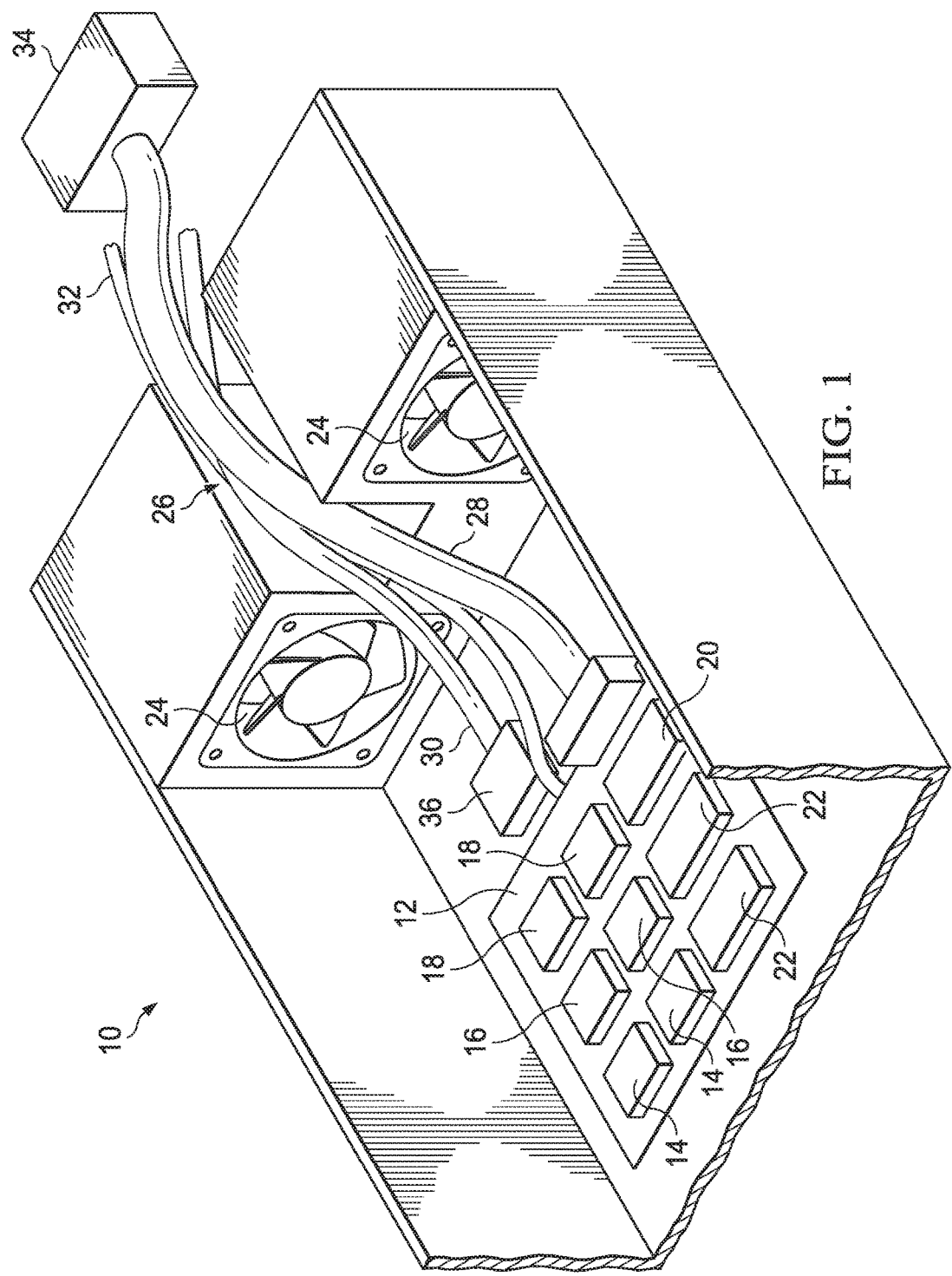
FIG. 1 depicts an upper perspective view of a server information handling system chassis having a selectively blocked cable channel.

Referring now to FIG. 1, an upper perspective view depicts a server information handling system chassis 10 having a selectively blocked cable channel 26. Server information handling system 10 processes information with processing components interfaced through a motherboard 12. In the example embodiment, plural central processing units (CPUs) 14 couple to motherboard 12 to execute instructions in cooperation with plural memories, such as random access memory (RAM) 16. One or more chipsets 18 include processing resources and flash memory that cooperate to manage interaction of CPUs 14 with external interfaces, such as a keyboard, mouse and network interface. For instance, chipset 18 includes an embedded controller, such as a baseboard management controller, that manages distribution of power, networking and cooling resources within information handling system chassis 10. Persistent storage devices, such as solid state drives 20 and hard disk drives 22, store information when powered down, such as an operating system and applications executed on CPUs 14. During operation of the processing components, one or more cooling fans 24 generate a cooling airflow that passes over the processing components to remove excess thermal energy.

In the example embodiment, a variety of cables pass between the interior and exterior of information handling system chassis 10 through a cable channel 26 defined between cooling fans 24. For example a power cable 28 communicates power to a power supply 34, an Ethernet cable 30 communicates networking information with a switch 36 and an HID cable communicates keyboard or other human interface device information with an embedded controller, such as a keyboard controller in chipset 18. The number and types of cables vary depending on the processing component configuration of information handling system 10, such as the number and type of persistent storage devices, networking devices, graphics cards or other interfaces that use a cable to communicate information external to information handling system chassis 10. Cable channel 26 has a fixed size defined between cooling fans 24 with a length of approximately that of the cooling fans 24. Although cables 28-32 passing through cable channel 26 tend to block some airflow through cable channel 26 the amount of airflow that passes may vary significantly unless cable channel 26 is filled around the cables. For example, as cooling fans 24 pull air across the processing components, excessive room for passing air through cable channel 26 may result in recirculation of air that reduces effective cooling airflow across the processing components. As set forth below in greater detail, a blocking element disposed in cable channel 26 proximate the processing components biases against the cables to close off cable channel 26 in a selectable manner that adapts to the size of the cables passing through cable channel 26. Although the example embodiment defines a cable channel between cooling fans 24, in alternative embodiments other types of arrangements of processing and cooling components may be used, such as a single cooling fan and/or a cable channel defined away from the cooling fan location. The example embodiment defines the cable channel with walls integrated into information handling system chassis 10, however, other types of structures may be used to guide the cables between the interior and exterior of information handling system chassis 10.

Figure 2:
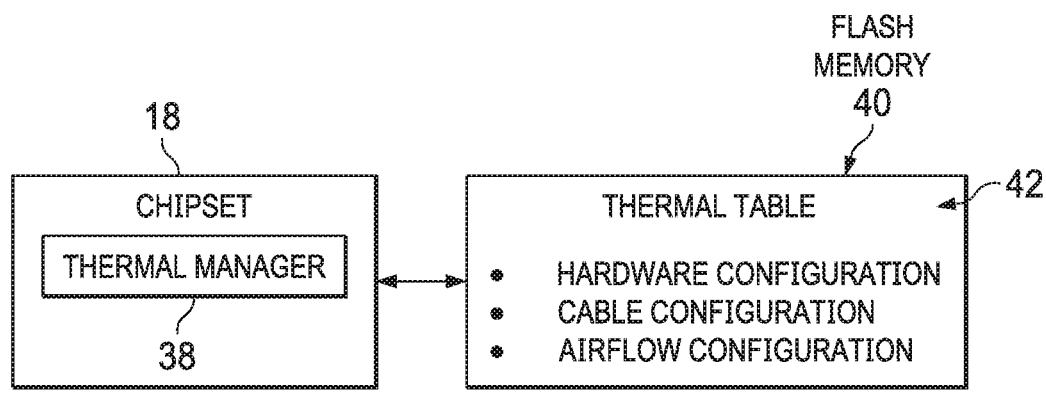
FIG. 2 depicts a block diagram of system that adapts a fan speed controller to a cable configuration.

Referring now to FIG. 2, a block diagram depicts system that adapts a fan speed controller to a cable configuration. In the example embodiment, chipset 18 includes a thermal manager 38 stored in non-transient memory and executable to define a thermal profile for operating cooling fans in information handling system 10, such as at speeds adapted for the configuration within the information handling system chassis 10. A thermal table 42 stores a hardware configuration for the information handling system, such as an inventory of components polled by a baseboard management controller. For instance, the hardware configuration is automatically updated as new components are installed and detected. A cable configuration is estimated based upon the hardware configuration and used to adjust an expected airflow configuration. For instance, as persistent storage devices are added to the information handling system, cable routing between the added device and the chassis exterior is imputed and applied to define airflow characteristics associated with the cable channel. The airflow characteristics may vary based upon an expected airflow passage through the cable channel and also the impedance that the cable routing through the chassis interior will generate. The airflow configuration is then applied to adjust cooling fan speed to adapt to the expected airflow within the chassis interior based upon the cable routing. For instance, a large cable bundle of plural cables passing through the cable channel may increase cooling fan speed for a given thermal condition to overcome expected airflow impedance and loss related to the cable routing.

Figure 3A:
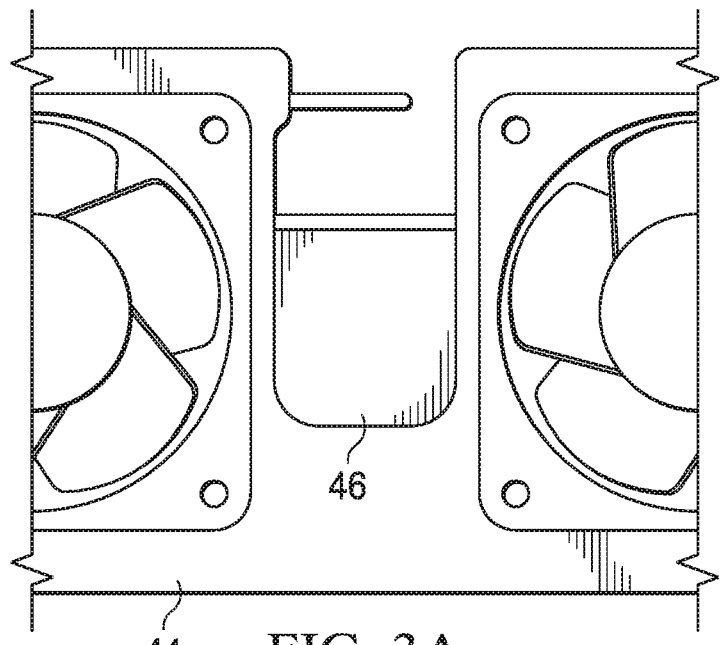
Figure 3D:
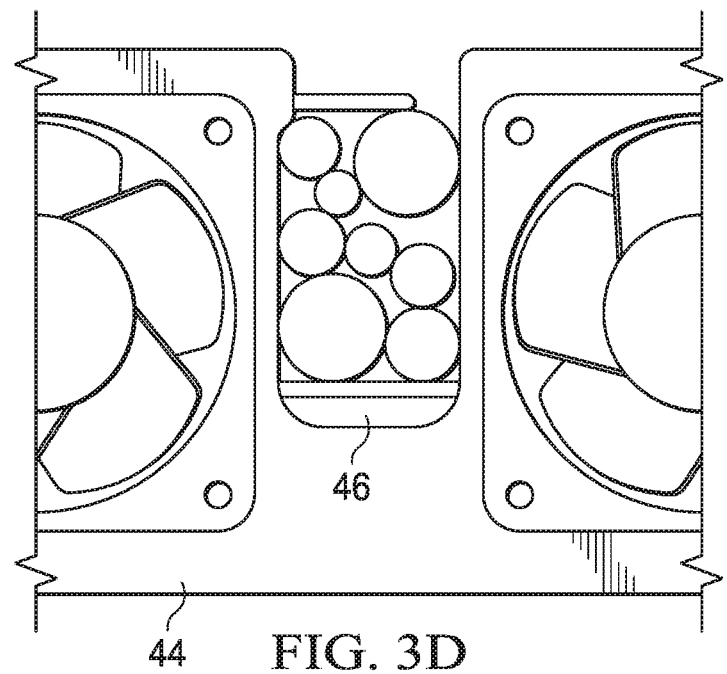

Referring now to FIG. 3A-3D, a cable channel is depicted disposed between cooling fans 24 and adapting to different cable configurations. In the example embodiment, a blocking element 46 slidingly engages in a slot defined by a chassis wall 44 to selectively close cable channel 26. FIG. 3B depicts a power cable 28, Ethernet cable 30 and HID cable 32 passing through cable channel 26 and compressed against an upper surface of cable channel 26 by an upward biasing of blocking element 46. FIG. 3C depicts additional cables routed through cable channel 26 that overcome the upward biasing force of blocking element 46 so sufficient room is provided to pass the additional cables. The upward biasing force provided by blocking element 46 compresses the cables against the upper surface of cable channel 26 so that minimal room is provided to pass airflow through cable channel 26. In FIG. 3D, cable channel 26 has substantially filled with cables so that blocking element 26 has been compressed to the base of chassis wall 44 by the bulk size of the cables in cable channel 26. In the example embodiment, the size of cable channel 26 with blocking element 46 completely slid into chassis wall 44 meets the greatest expected cable bulk for the available hardware configurations of the information handling system. In the example embodiment, blocking element 46 retracts downward as cables are included in cable channel 26, however in an alternative embodiment, blocking element 46 may retract upward. As cables are removed from cable channel 26, the cable configuration reverts to FIGS. 3C-3A with blocking element biasing back into cable channel 26 to prevent airflow passage through cable channel 26.

Figure 4:
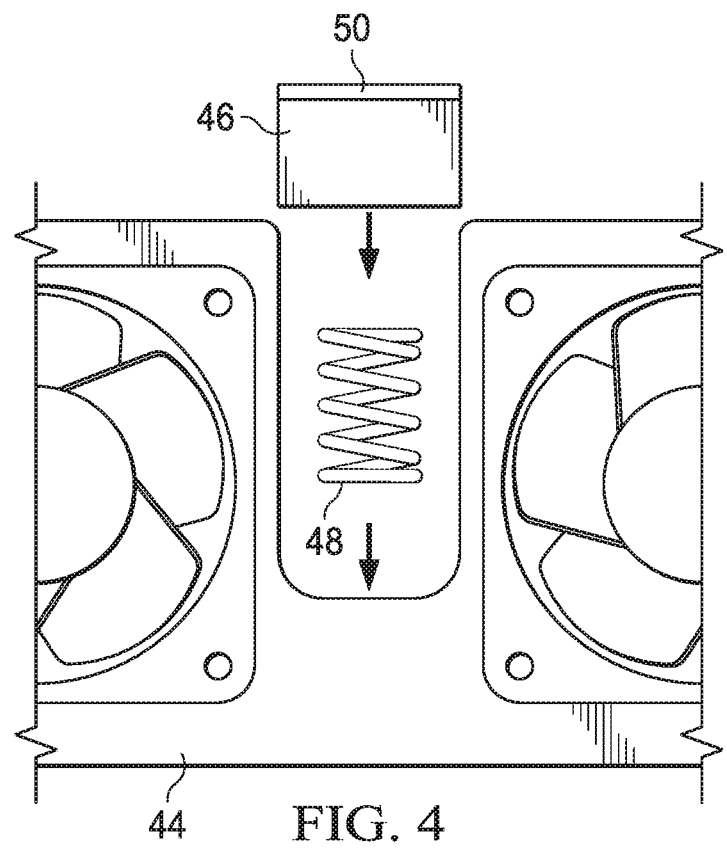
FIG. 4 depicts a blown-up view of a cable channel blocking element.

Referring now to FIG. 4, a blown-up view depicts once example of a cable channel blocking element 46. Block element 46 is, for example, a metal or plastic plate that slides in slots defined along the edge of wall 44. A spring 48 or other biasing mechanism biases blocking element 46 into cable channel 26 to prevent undesired airflow. Insulation or similar packing material disposed along the upper edge of blocking element 46 fills in pockets between cables that compress against the upper surface of blocking element 46. The amount of bias provided by spring 48 is selected with a spring resiliency sufficient to lift the expected weight of cables passing through cable channel 26 so that sufficient compression is applied against the cables to manage space within cable channel 26 and minimizes airflow that escapes through gaps in the cables.

Although the present invention has been described in detail, it should be understood that various changes, substitutions and alterations can be made hereto without departing from the spirit and scope of the invention as defined by the appended claims.

What is claimed is:

1. An information handling system comprising: a chassis having an exterior and an interior; processing components disposed in chassis interior, the processing components cooperating to process information; a structure disposed in the chassis to define a cable channel between the exterior of the chassis and the interior of the chassis; one or more cooling fans integrated with the chassis to generate a cooling airflow' through the chassis interior; one or more cables routed from the chassis interior through the cable channel to the chassis exterior; and a blocking element disposed in the cable channel at the chassis interior and biased to a closed position that blocks airflow' out the cable channel, the cables overcoming the biasing to pass by the blocking element; and further comprising a spring integrated with the blocking element, the spring biasing the blocking element to a closed position within the cable channel.

2. The information handling system of claim 1 further comprising: a cooling fan disposed on each side of the cable channel, each cooling fan operable to force air between the chassis interior and exterior; and a thermal manager interfaced with the cooling fan to set a speed for the cooling fan.

3. The system of claim 2 wherein the thermal manager applies a processing component configuration determined from communication with the processing components to set the cooling fan speed.

4. The system of claim 3 wherein the thermal manager applies the processing component configuration to estimate a cable configuration having an associated airflow configuration.

5. The system of claim 1 further comprising insulation disposed at the blocking element proximate the cables, the insulation restricting airflow through the cable channel.

6. The system of claim 1 wherein the cables comprise at least a power cable, a network cable and a human interface device cable.

7. The system of claim 1 wherein the processing components comprise plural persistent storage devices.

8. The system of claim 1 further comprising a cooling fan integrated in the chassis proximate the cable channel, the cooling fan having a length, the cable channel having a length of the cooling fan length.

9. A method for routing plural cables out of an information handling system chassis, the method comprising: coupling each of the plural cables to one or more of plural processing components disposed in the chassis; routing the plural cables through a cable channel and out of the chassis; and biasing a blocking element disposed in the cable channel towards a closed position, the blocking element pressing the plural cables into a compressed position that blocks airflow through the cable channel; wherein biasing a blocking element further comprises: biasing a door upwards from a base of the chassis to dose the cable channel at an interior of the chassis; and overcoming the biasing to open the door downwards so that the plural cables pass from the chassis interior into the cable channel.

10. The method of claim 9 further comprising:
routing one or more additional cables through the cable channel; and
providing space for the additional cables by pressing against the blocking element with the additional cables.

11. The method of claim 10 further comprising:
inserting insulation on the blocking element; and closing the cable channel by compressing the insulation with the biasing.

12. The method of claim 9 wherein the plural cables comprise at least a power cable that communicates power from an exterior of the chassis to an interior of the chassis.

13. The method of claim 10 further comprising:
detecting processing components disposed in the chassis;
estimating a cable configuration for cables that pass through the cable channel based upon the detected processing components; and
adapting cooling fan speed associated with the chassis based at least in part upon the estimated cable configuration.

14. The method of claim 9 wherein the processing components comprise persistent storage devices disposed in the chassis.

15. The method of claim 9 wherein the plural cables comprise at least a human interface device cable.

16. A system for routing cables in an information handling system, the system comprising: first and second parallel walls extending between the information handling system chassis exterior and interior to define a cable channel; a blocking element slidingly engaged in the cable channel at the chassis interior to selectively open and close the cable channel; and a biasing device engaged with the blocking element and biasing the blocking element to close the cable channel, the blocking element pressing any cables passing through the cable channel into a confined space; and further comprising a spring integrated with the blocking element, the spring biasing the blocking element to a closed position within the cable channel.

17. The system of claim 16 further comprising:
a controller interfaced with a cooling fan and with processing components of the information handling system; and
a thermal manager stored in non-transitory memory and executable by the controller, the thermal manager adapting cooling fan operations based at least in part upon a cable configuration estimated from the processing components interfaced with the controller.

18. The system of claim 17 wherein the cables comprise at least one of a power cable, network cable or human interface device cable.

* * * * *